(12) United States Patent
Harris et al.

(10) Patent No.: US 9,518,311 B2
(45) Date of Patent: Dec. 13, 2016

(54) HIGH STRENGTH SINGLE CRYSTAL SUPERALLOY

(71) Applicant: Cannon-Muskegon Corporation, Muskegon, MI (US)

(72) Inventors: Kenneth Harris, Spring Lake, MI (US); Jacqueline B. Wahl, Norton Shores, MI (US)

(73) Assignee: Cannon-Muskegon Corporation, Muskegon, MI (US)

( * ) Notice: Subject to any disclaimer, the term of this patent is extended or adjusted under 35 U.S.C. 154(b) by 348 days.

(21) Appl. No.: 14/272,627

(22) Filed: May 8, 2014

(65) Prior Publication Data

US 2015/0322550 A1    Nov. 12, 2015

(51) Int. Cl.
*C22C 19/05*    (2006.01)
*C30B 29/52*    (2006.01)
*C30B 11/00*    (2006.01)

(52) U.S. Cl.
CPC .............. *C22C 19/057* (2013.01); *C22C 19/05* (2013.01); *C30B 11/00* (2013.01); *C30B 29/52* (2013.01)

(58) Field of Classification Search
CPC ................................ C22C 19/057; C22F 1/10
See application file for complete search history.

(56) References Cited

U.S. PATENT DOCUMENTS

| 5,366,645 A | 11/1994 | Sobottka |
| 5,540,790 A | 7/1996 | Erickson |
| 6,419,763 B1 * | 7/2002 | Konter ................. C22C 19/056 148/404 |

FOREIGN PATENT DOCUMENTS

| EP | 1054072 A1 | 11/2000 |
| EP | 2612936 A2 | 7/2013 |
| GB | 2404924 A | 2/2005 |
| WO | WO-93/24683 A1 | 12/1993 |

OTHER PUBLICATIONS

Ezugwu, E. O., Z. M. Wang, and A. R. Machado. "The machinability of nickel-based alloys: a review." Journal of Materials Processing Technology 86.1 (1999): 1-16.*
European Search Report dated Sep. 21, 2015, 6 pages.
Cannon Muskegon Tech Papers, TMS Seven Springs, Superalloy Symposium, "New Single Crystal Superalloys, CMSX -7® and CMSX -8®," Jacqueline B. Wahl and Ken Harris, Sep. 2012.
Proceedings of ASME Turbo Expo 2014: Turbine Technical Conference and Exposition, "New Single Crystal Superalloys, CMSX -8® and CMSX -7®," Dusseldorf, Germany, Jun. 16-20, 2014.

* cited by examiner

*Primary Examiner* — Jessee Roe
(74) *Attorney, Agent, or Firm* — Butzel Long

(57) ABSTRACT

A nickel-base superalloy for single crystal casting of components exhibiting excellent creep and rupture properties at high temperature and stresses, and which exhibits excellent phase stability contains 5.60% to 5.80% by weight of aluminum; 9.4% to 9.8% by weight of cobalt; 3.2% to 3.9% by weight of chromium; 7.8% to 8.5% by weight of tantalum; 5.3% to 5.7% by weight of tungsten; 0.50% to 0.70% by weight of molybdenum; 4.3% to 4.9% by weight of rhenium; 0.75% to 0.90% by weight of titanium; 0.08% to 0.15% by weight of hafnium; less than 1.1% by weight of tramp elements other than aluminum, cobalt, chromium, tantalum, tungsten, molybdenum, rhenium, titanium and nickel; and balance nickel.

12 Claims, 11 Drawing Sheets

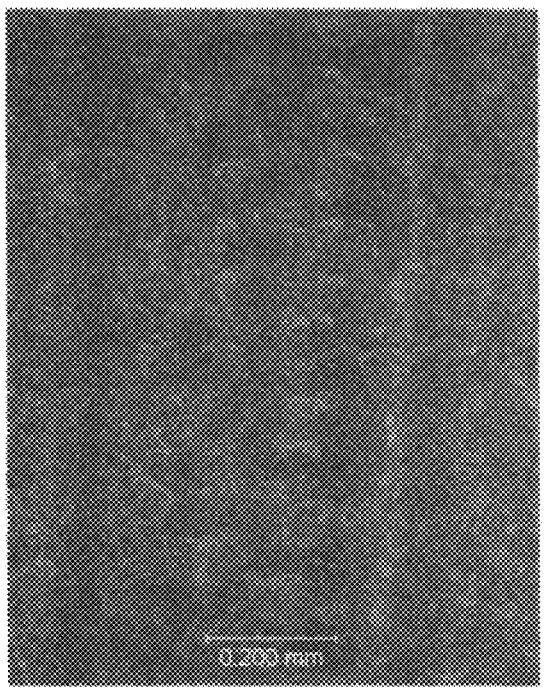
FIGURE 5
FIGURE 6

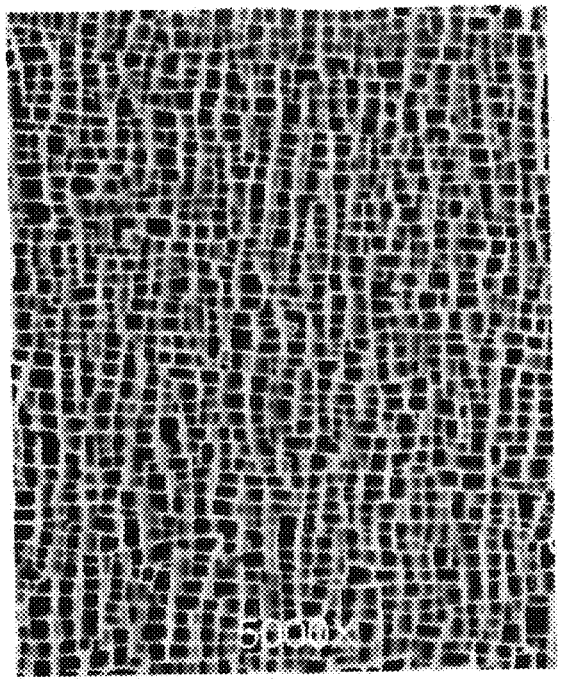
FIGURE 7
FIGURE 8
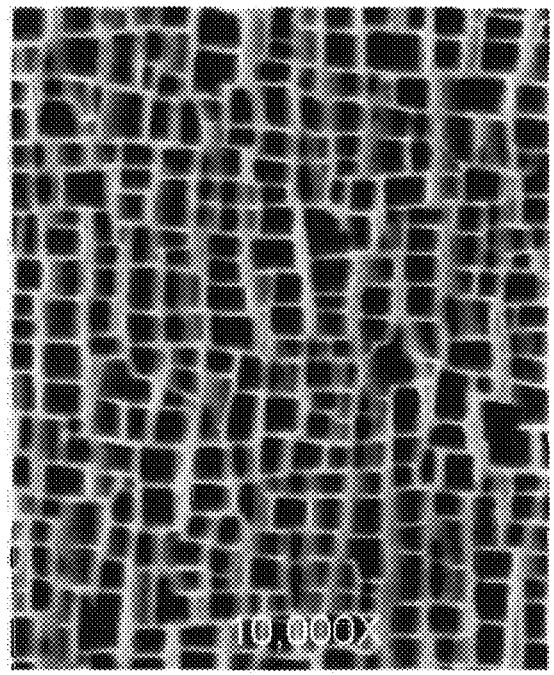

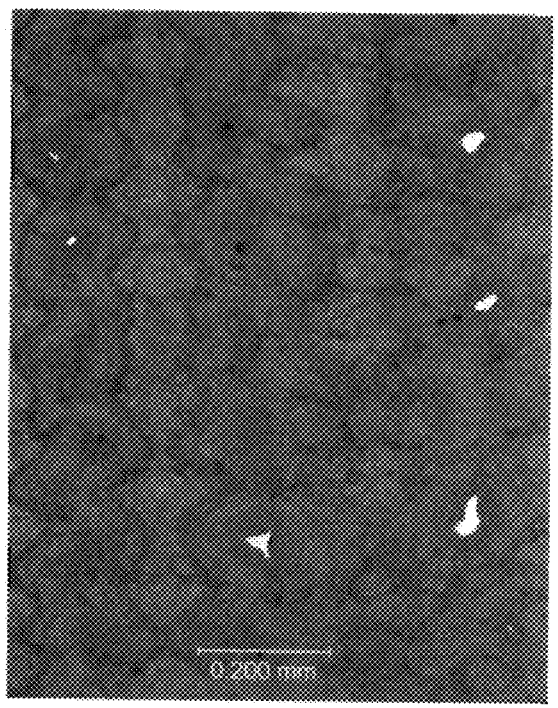
FIGURE 9
FIGURE 10
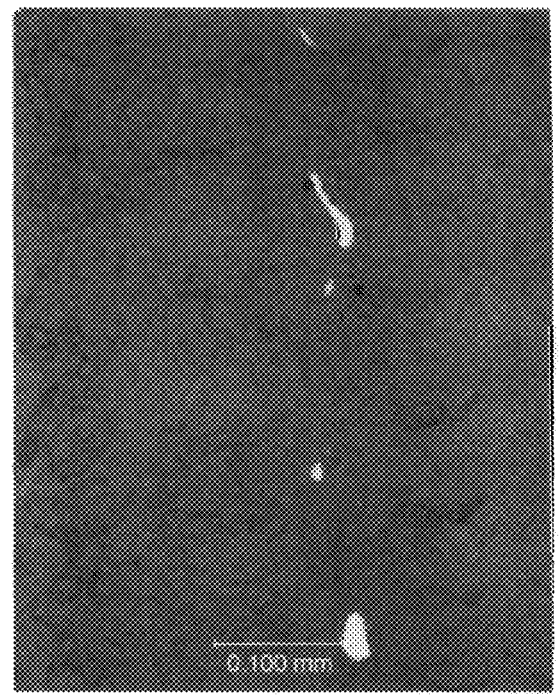

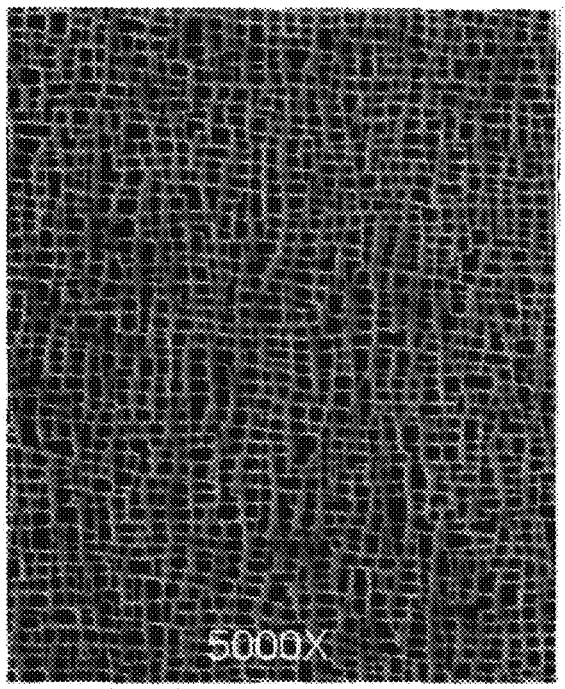
FIGURE 11
FIGURE 12
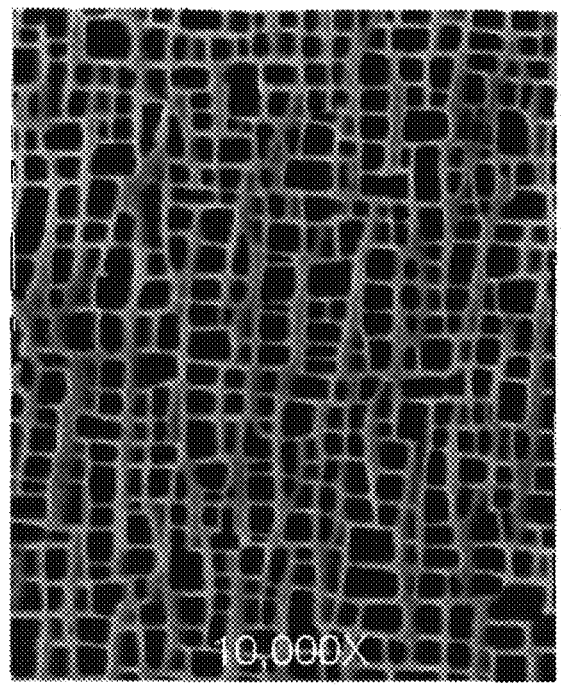

FIGURE 13
FIGURE 14
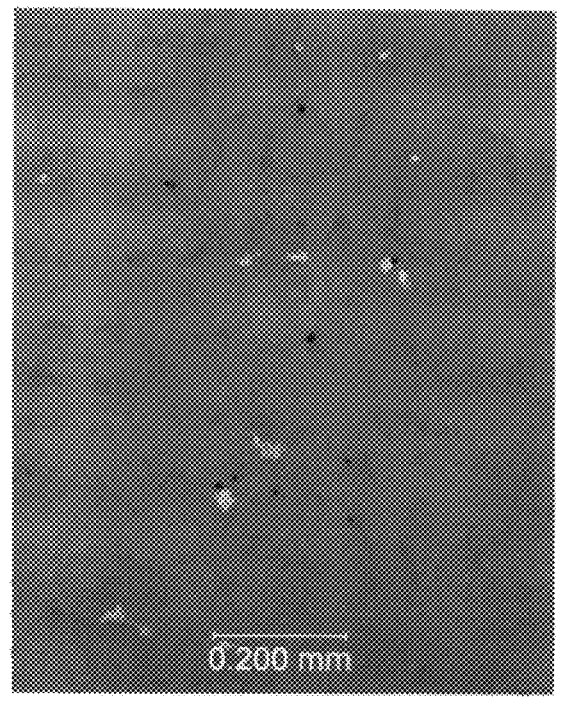

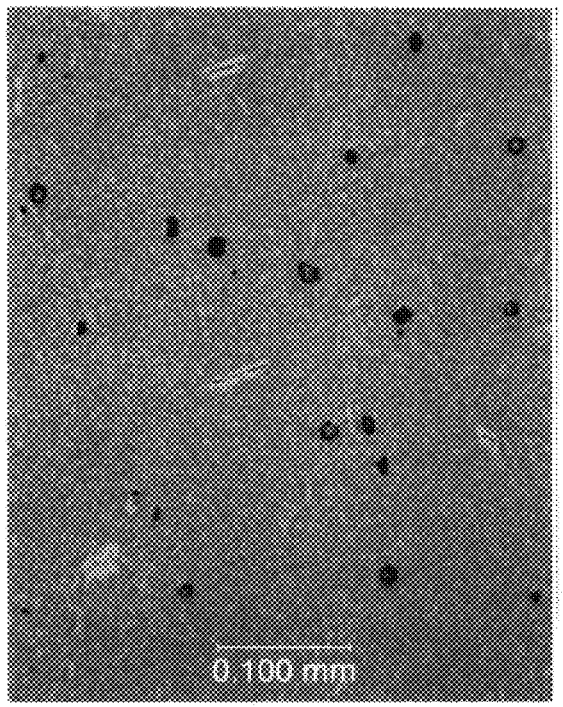
FIGURE 17
FIGURE 18
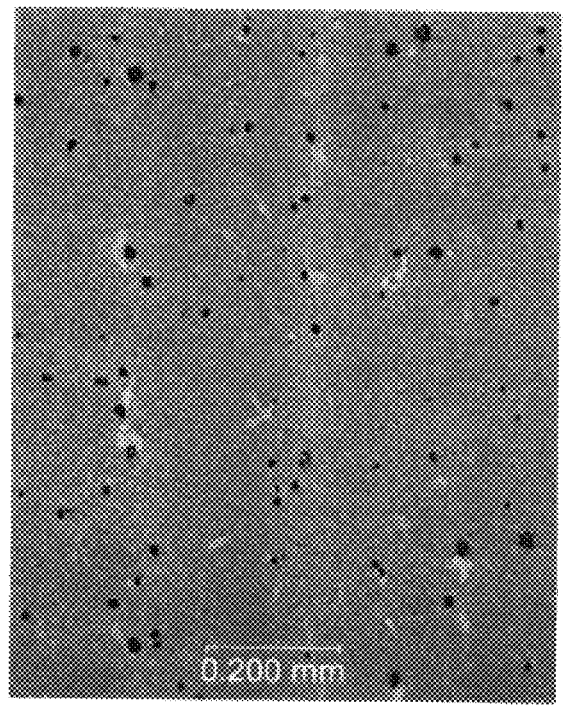

HIGH STRENGTH SINGLE CRYSTAL SUPERALLOY

CROSS-REFERENCE TO RELATED APPLICATIONS

Not applicable.

FIELD OF THE DISCLOSURE

Nickel-base superalloys for single crystal castings exhibiting a balanced combination of outstanding properties are disclosed.

BACKGROUND OF THE DISCLOSURE

There is a continuing demand for advanced gas turbines that achieve lower fuel burn rates and commensurate reduced carbon dioxide exhaust emissions. Therefore, there remains a pressing need for superalloys that can be cast into complex cooled turbine blades and vanes that are capable of operating at higher gas and metal temperatures. These castings desirably exhibit a combination of high strength, excellent high temperature, creep-rupture properties, and good phase stability.

Single crystal nickel-base superalloys typically contain high levels of refractory elements such as molybdenum, tungsten, rhenium and tantalum in order to improve high temperature creep-rupture properties. However, high levels of these elements can result in topologically close-packed (TCP) phase formation during high temperature stressed exposure, which can be associated with the development of sites for premature crack initiation, resulting in a degradation of long term creep-rupture properties. As such, the selection of appropriate levels of refractory elements and chromium content involves a delicate balancing of strength properties against long term phase stability. The TCP phases are rhenium and tungsten rich with some chromium. Excessive formation of TCP phases de-alloy the material, thus lowering the creep-rupture strength.

The highest strength nickel-base superalloys for single crystal castings for use in flight engines contain about 5% to about 7% rhenium by weight. These include CMSX-10K® and CMSX-10N® alloys, developed and available from Cannon-Muskegon Corporation and described in U.S. Pat. Nos. 5,366,645 and 5,540,790, and Rene N-6 alloy, developed by the General Electric Company. However, these specialty, high-strength nickel-base superalloys have exhibited certain undesirable features for particular applications. These alloys tend to develop a type of phase instability due to the high rhenium-content, which is known as a secondary reaction zone (SRZ) instability, that is observed in the base alloy adjacent to the coatings, which results in coating compatibility and thin-wall mechanical property issues. Additionally, CMSX-10K® and CMSX-10N® alloys have a very low chromium content (1.5% and 2.2% by weight respectively) to accommodate the high rhenium content, which consequently reduces low temperature internal oxidation resistance and hot corrosion resistance. These alloys also have high $\gamma'$ solvus temperatures, requiring a very high temperature solution heat treatment, which can cause surface melting issues. These alloys also tend to have a relatively high density, which is a significant weight and inertia disadvantage for flight engines, especially for rotating turbine blades. These very high strength specialty alloys are also expensive due to the high price of rhenium, which has approximately quadrupled in the last 20 years.

SUMMARY OF THE DISCLOSURE

The disclosed alloys were designed and developed to provide a single crystal casting with creep and fatigue properties similar to the very high strength nickel-base superalloys containing about 5% to about 7% rhenium by weight, but which contain substantially less rhenium, thereby eliminating SRZ phase instability issues, improving low temperature internal oxidation resistance and hot corrosion resistance, reducing the $\gamma'$ solvus temperature, reducing density, reducing cost, and providing a combination of these advantages, and while also providing significantly improved high temperature creep-rupture properties as compared to a CMSX-4® alloy containing 3% rhenium by weight.

The disclosed alloys exhibiting improved properties contain 5.60% to 5.80% by weight of aluminum; 9.4% to 9.8% by weight of cobalt; 3.2% to 3.9% by weight of chromium; 7.8% to 8.5% by weight of tantalum; 5.3% to 5.7% by weight of tungsten; 0.50% to 0.70% by weight of molybdenum; 4.3% to 4.9% by weight of rhenium; 0.75% to 0.90% by weight of titanium; 0.08% to 0.15% by weight of hafnium; less than 1.1% by weight of tramp elements other than aluminum, cobalt, chromium, tantalum, tungsten, molybdenum, rhenium, titanium and nickel; and the balance nickel.

In certain aspects of this disclosure, the nickel-base superalloy contains a total amount of tantalum, molybdenum, tungsten and rhenium of from 18.2% to 19.5% by weight.

In certain aspects of this disclosure, the nickel-base superalloy contains a total amount of aluminum, titanium and tantalum that is from 14.25% to 15.0% by weight.

In certain aspects of this disclosure, the nickel-base superalloy contains the following maximum amounts by weight of elements: 100 ppm carbon, 0.04% silicon, 0.01% manganese, 3 ppm sulfur, 30 ppm phosphorus, 30 ppm boron, 0.15% niobium, 150 ppm zirconium, 0.01% copper, 0.15% iron, 0.10% vanadium, 0.15% ruthenium, 0.25% platinum, 0.20% palladium, 0.02% magnesium, 5 ppm nitrogen, 5 ppm oxygen, 2 ppm silver, 0.2 ppm bismuth, 10 ppm gallium, 25 ppm calcium, 1 ppm lead, 0.5 ppm selenium, 0.2 ppm tellurium, 0.2 ppm thallium, 10 ppm tin, 2 ppm antimony, 2 ppm arsenic, 5 ppm zinc, 2 ppm mercury, 0.2 ppm cadmium, 0.2 ppm indium, 2 ppm germanium, 2 ppm gold, 20 ppm sodium, 10 ppm potassium, 10 ppm barium, 2 ppm thorium, and 2 ppm uranium.

BRIEF DESCRIPTION OF THE DRAWINGS

FIGS. 5 and 6 are optical photographs of a CMSX-4® PLUS (MOD A) single crystal test bar (#52JFT) that was fully heat treated.

FIGS. 7 and 8 are scanning electron micrographs of the CMSX-4® PLUS (MOD A) single crystal test bar (#52JFT) that was fully heat treated.

FIGS. 9 and 10 are optical photographs of a CMSX-4® PLUS (MOD B) single crystal test bar (#M975) that was solutioned and primary aged.

FIGS. 11 and 12 are scanning electron micrographs of the CMSX-4® PLUS (MOD B) single crystal test bar (#M975) that was solutioned and primary aged.

FIGS. 13 and 14 are optical photographs of a CMSX-4® PLUS (MOD C) single crystal test bar (#B981) that was fully heat treated.

FIGS. 17 and 18 are optical photographs of a CMSX-4® PLUS (MOD C) single crystal test bar (#N978) that was fully heat treated and stress-rupture tested.

DETAILED DESCRIPTION

Figure 1:
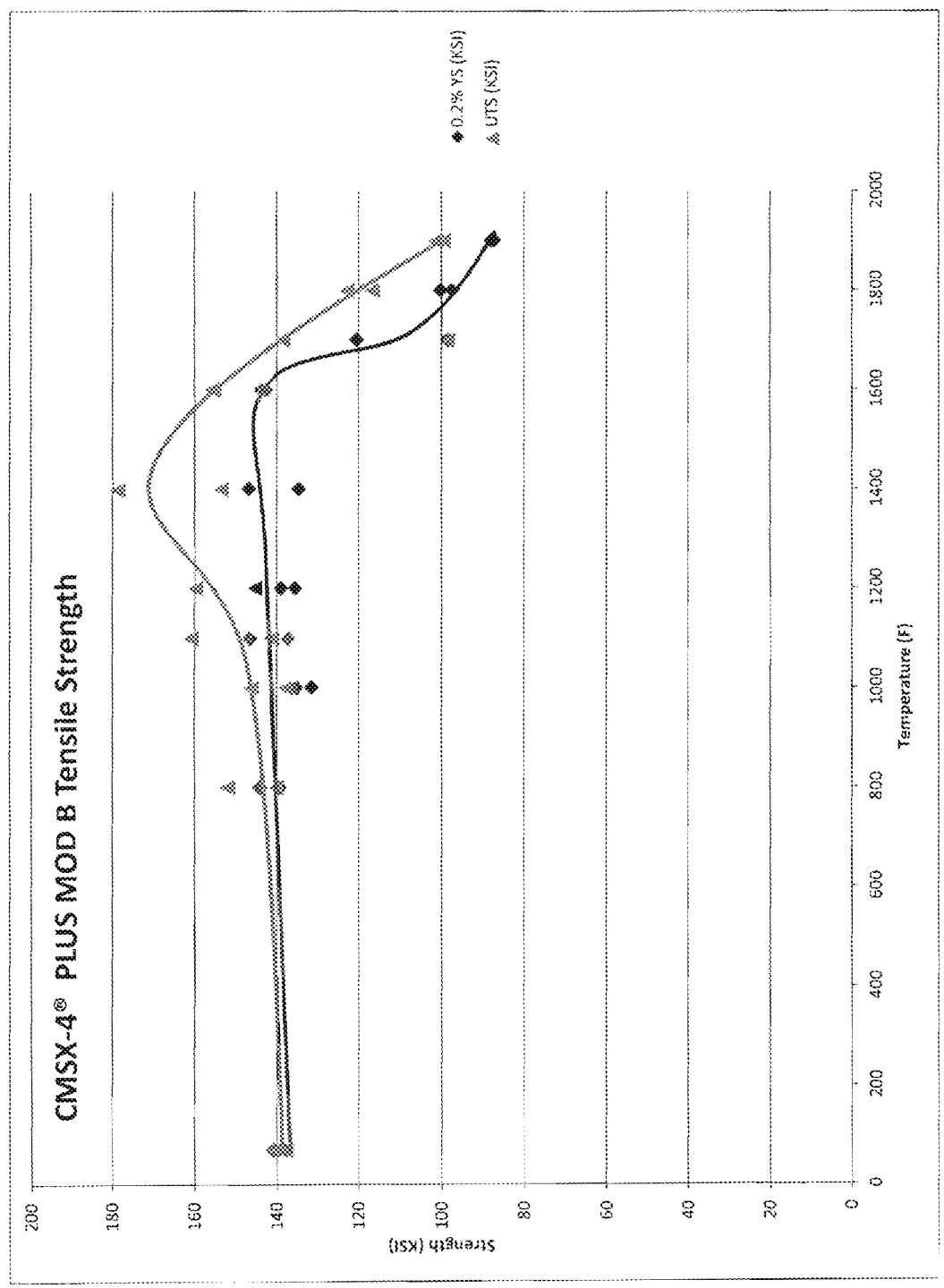
FIG. 1 is a graph of yield strength and ultimate tensile strength as a function of temperature for an alloy as disclosed herein.

The high strength nickel-base superalloys for single crystal casting of this disclosure will be designated "CMSX-4® PLUS" alloys.

The alloy chemistry is developed from that of CMSX®-8 alloy (CM Tech Papers TMS Seven Spring Superalloy Symposium, September 2012; and ASME Turbo Expo, Dusseldorf, June 2014). The CMSX®-8 alloy exhibits excellent single crystal castability and high temperature oxidation resistance. This 1.5% by weight rhenium containing alloy has creep-rupture properties close to but somewhat less than CMSX-4® alloy.

Rhenium content was selected about 4% with the objective of providing a desirable balance between appreciably enhancing high temperature creep-rupture properties over CMSX-4®, and undesirably promoting SRZ phase occurrence under coatings and excessive TCP phase formation in turbine components during high temperature, stressed exposure.

A Cr content of about 3% to about 4% was selected to promote low temperature oxidation and hot corrosion (sulfidation) resistance.

The Mo content was critically left low at 0.60% to avoid oxidation issues. This necessitated using Ti in the alloy in range of 0.75-0.90% to ensure appropriate γ/γ' mis-match and interfacial chemistry and hence ensure approximately 0.5 μm cubic, aligned γ' for solutioned/homogenized and high temperature primary age heat treated microstructures. This maximizes creep-rupture properties. Ti also reduces alloy density. The Ti content additionally improves transformation potential as part of the raw material mix.

Ta content was maintained as per CMSX®-8 alloy in the 8% regime to maximize single crystal castability/airfoil component casting yield, by minimizing propensity for "freckle-chain" grain defects and avoiding the necessity for unduly high W content (maintained in the 5.0-5.5% regime). High W encourages "freckle" formation and reduces oxidation resistance. Ta is also an active γ' former (simplified γ' composition $Ni_3$ (Al, Ti, Ta)), besides being a powerful, large atom, solid solution strengthener.

Hf was maintained at about 0.10% to ensure acceptable solution heat treat "windows" for these highly alloyed CMSX-4® Plus chemistry compositions. Hf improves coating performance under oxidizing conditions, but reduces incipient melting point greater than its reduction in γ' solvus temperature. This effect increases with higher Hf levels.

The 470 lb 100% virgin (100V) VIM heats were made at Cannon-Muskegon Corporation using state of the art melting practices and very high purity materials for this alloy development program, which were all made with the following tight controls on deleterious trace elements:

Wt PPM

| | | | |
|---|---|---|---|
| Ag | <.4 | U | <.5 |
| Bi | <.1 | Th | <1 |
| Ga | <10 | Cd | <.2 |
| Pb | <.5 | Ge | <1 |
| Se | <.5 | Pt | <.005% |
| Te | <.2 | Au | <.5 |
| Tl | <.2 | In | <.2 |

-continued

| | | | |
|---|---|---|---|
| Sn | <2 | Na | <10 |
| Sb | <1 | K | <5 |
| As | <1 | Ca | <10 |
| Zn | <1 | Ba | <5 |
| Hg | <2 | Mg | <200 ppm |

CMSX-4® Plus (Mod A)

A 470 lb VIM heat (100V) [5V0603] was made in the CM V-5 furnace in February 2013. The heat chemistry, which was very close to the design target, is shown below:

| | 5V0603 Heat Chemistry Wt % or PPM | RR Corpn. DL-10 Test Bar Mold #968 Wt % or PPM | SMP SX Test Bar Mold 52J . . . Wt % or PPM |
|---|---|---|---|
| C | 21 ppm | 26 ppm | 31 ppm |
| S | 1 ppm | 1 ppm | 1 ppm |
| Si | <.01 | .01 | .01 |
| Mn | <.001 | <.01 | <.01 |
| Al | 5.80 | 5.73 | 5.70 |
| B | <20 ppm | <20 ppm | <20 ppm |
| Cb | <.05 | <.05 | <.05 |
| Co | 9.7 | 9.6 | 9.7 |
| Cr | 4.2 | 4.3 | 4.2 |
| Cu | <.001 | <.001 | <.001 |
| Fe | .015 | <.05 | <.05 |
| Hf | .13 | .14 | .13 |
| Mo | .60 | .61 | .61 |
| Ni | BAL | BAL | BAL |
| [N] | 1 ppm | 1 ppm | 2 ppm |
| [O] | 1 ppm | 2 ppm | 2 ppm |
| P | 6 ppm | 10 ppm | 6 ppm |
| Re | 4.0 | 3.9 | 4.0 |
| Ru | <.01 | <.01 | <.01 |
| Ta | 8.4 | 8.4 | 8.4 |
| Ti | .66 | .67 | .65 |
| W | 5.3 | 5.4 | 5.3 |
| Zr | <25 ppm | <25 ppm | <25 ppm |
| V | <.005 | <.01 | <.01 |
| Y | <.001 | — | — |
| La | <.001 | — | — |
| Ce | <.002 | — | — |
| Mg | <200 ppm | 2 ppm | 1 ppm |
| [Ta + W + Mo + Re] | 18.30 | 18.31 | 18.31 |
| [Al + Ti] | 6.46 | 6.40 | 6.35 |
| [Al + Ti + Ta] | 14.86 | 14.80 | 14.75 |

Single crystal test bars (within 10° of (001)) were successfully cast using established CMSX-4® casting parameters at two production single crystal foundries (Rolls-Royce Corporation and SMP (PCC Airfoils)) with high yields and excellent chemistry retention.

Multi-step solutioning/homogenization and high temperature primary aging steps were researched to develop the microstructures shown in FIGS. 5, 6, 7, 8, 9, 10, 11, 12, 13, 14, 15 and 16.

The peak solution-homogenization temperature selected was 2435° F. (1335° C.)—(6 hrs) with primary age of 2085° F. (1140° C.)—(6 hrs).

All single crystal specimen machining (low stress grinding) and creep-stress-rupture testing were undertaken by Joliet Metallurgical Labs, Joliet, Ill.

The creep-rupture properties attained with Mod A although improved compared to CMSX-4® up to 1922° C. (1050° C.), were well short of the target properties (Table 1 and Tables 4, 5 and 6).

CMSX-4® Plus (Mod B)

To target higher creep-rupture properties, a 470 lb heat (100V) [5V0636] was made in the CM V-5 furnace in July 2013.

The heat chemistry which was very close to the design target, is shown below.

| | 5V0636 Heat Chemistry Wt % or PPM | RR Corpn. DL-10 Test Bar Mold #968 Wt % or PPM | RR Corpn. DL-10 Test Bar Mold #977 Wt % or PPM | RR Corpn. DL-10 Test Bar Mold #982 Wt % or PPM | RR Corpn. DL-10 Test Bar Mold #983 Wt % or PPM |
|---|---|---|---|---|---|
| C | 16 ppm | 41 ppm | 30 ppm | 78 ppm | 47 ppm |
| S | 1 ppm | 1 ppm | 1 ppm | 1 ppm | 1 ppm |
| Si | <.01 | <.01 | <.01 | <.01 | .02 |
| Mn | <.001 | <.01 | <.01 | <.01 | <.01 |
| Al | 5.71 | 5.62 | 5.68 | 5.70 | 5.70 |
| B | <20 ppm | <20 ppm | <20 ppm | <20 ppm | <20 ppm |
| Cb | <.05 | <.05 | <.05 | <.05 | <.05 |
| Co | 9.6 | 9.6 | 9.6 | 9.6 | 9.5 |
| Cr | 3.7 | 3.7 | 3.7 | 3.7 | 3.6 |
| Cu | <.001 | <.001 | <.001 | <.001 | <.001 |
| Fe | .012 | <.05 | <.05 | <.05 | <.05 |
| Hf | .10 | .11 | .10 | .10 | .10 |
| Mo | .60 | .61 | .60 | .60 | .60 |
| Ni | BAL | BAL | BAL | BAL | BAL |
| [N] | 1 ppm | 1 ppm | 1 ppm | 1 ppm | 1 ppm |
| [O] | 1 ppm | 3 ppm | 1 ppm | 3 ppm | 2 ppm |
| P | 4 ppm | 8 ppm | 8 ppm | 1 ppm | 1 ppm |
| Re | 4.55 | 4.53 | 4.52 | 4.47 | 4.47 |
| Ru | <.01 | <.01 | <.01 | — | — |
| Ta | 8.0 | 8.0 | 8.0 | 8.0 | 8.0 |
| Ti | .82 | .81 | .82 | .82 | .81 |
| W | 5.5 | 5.5 | 5.5 | 5.5 | 5.5 |
| Zr | <25 ppm | <25 ppm | <25 ppm | <.005 | <.005 |
| V | <.005 | <.01 | <.01 | <.01 | <.01 |
| Y | <.001 | — | — | — | — |
| La | <.001 | — | — | — | — |
| Ce | <.002 | — | — | — | — |
| Mg | <200 ppm | 2 ppm | 2 ppm | 2 ppm | 2 ppm |
| [Ta + W + Mo + Re] | 18.65 | 18.64 | 18.62 | 18.57 | 18.57 |
| [Al + Ti] | 6.53 | 6.43 | 6.50 | 6.52 | 6.51 |
| [Al + Ti + Ta] | 14.53 | 14.43 | 14.50 | 14.52 | 14.51 |

The creep-rupture properties attained with Mod B are now much more interesting which are well above CMSX-4® up to 1922° F. (1050° C.) (Table 2, 4, 5 and 6).

The full heat treatment conditions were "fine-tuned" from the previous Mod A work, with a peak solution/homogenization temperature of 2435° F. (1335° C.)—(6 hrs) and 2085° F. (1140° C.)—(6 hrs) primary age.

The density of the Mod B composition was determined by NPL in the UK to be 8.89 kg/dm$^3$ compared to 9.05 for CMSX-10K® (6.3% Re) and 8.95 for PWA 1484 (3% Re).

CMSX-4® Plus (Mod C)

To fully explore the potential of the chemistry development/performance concepts of this new alloy system, a further 470 lb heat [100V] [5V0660] was made in the Cannon-Muskegon Corporation V-5 furnace in October 2013. The heat chemistry which again was very close to the design target, is shown below:

| | 5V0660 Heat Chemistry Wt % or PPM | RR Corpn. DL-10 Test Bar Mold #978 Wt % or PPM | RR Corpn. DL-10 Test Bar Mold #981 Wt % or PPM |
|---|---|---|---|
| C | 19 ppm | 51 ppm | 66 ppm |
| S | 1 ppm | 1 ppm | 1 ppm |
| Si | <.01 | .02 | .01 |
| Mn | <.001 | <.01 | <.01 |
| Al | 5.73 | 5.68 | 5.70 |
| B | <20 ppm | <20 ppm | <20 ppm |
| Cb | <.05 | <.05 | <.05 |
| Co | 9.6 | 9.6 | 9.6 |
| Cr | 3.5 | 3.5 | 3.5 |
| Cu | <.001 | <.001 | <.001 |
| Fe | .010 | <.05 | <.05 |
| Hf | .10 | .10 | .12 |
| Mo | .60 | .60 | .60 |
| Ni | BAL | BAL | BAL |
| [N] | 1 ppm | 2 ppm | 1 ppm |
| [O] | 1 ppm | 2 ppm | 2 ppm |
| P | 4 ppm | 7 ppm | 1 ppm |
| Re | 4.87 | 4.81 | 4.83 |
| Ru | <.01 | — | — |
| Ta | 8.2 | 8.2 | 8.2 |
| Ti | .86 | .86 | .86 |
| W | 5.5 | 5.5 | 5.5 |
| Zr | <25 ppm | <25 ppm | <25 ppm |
| V | <.005 | <.010 | <.010 |
| Y | <.001 | — | — |
| La | <.001 | — | — |
| Ce | <.002 | — | — |
| Mg | <200 ppm | 2 ppm | 2 ppm |
| [Ta + W + Mo + Re] | 19.17 | 19.11 | 19.13 |
| [Al + Ti] | 6.59 | 6.54 | 6.56 |
| [Al + Ti + Ta] | 14.79 | 14.74 | 14.76 |

The creep-rupture properties of the Mod C chemistry (Table 3, 4, 5 and 6) are quite remarkable and surprising for relatively small changes in aim chemistry. The metal temperature stress-rupture capability advantage of Mod C over standard CMSX-4® is 40° F. (22° C.) at 1800° F. (982° C.) and 50° F. (28° C.) for 1.0% creep capability (density corrected). At the 15.0 ksi/2050° F. (103 MPa/1121° C.) very high temperature test condition, the Mod C is equivalent to CMSX-4® which has very exceptional stress-rupture life at this test condition, but with improved rupture ductility (17-28% Elong (4D) and 38-39% RA) compared to CMSX-4®.

Remarkably the density corrected creep-rupture properties of Mod C at 36.0 ksi/1800° F. (248 MPa/982° C.) are close to that of CMSX-10K® (6.3% Re) and superior at 15.0 ksi/2050° F. (103 MPa/1121°). (Table 7).

The heat treatment used a peak solution/homogenization step of 2435° F. (1335° C.)—(6 hrs) and two (2) differing primary ages (a) 2100° F. (1149° C.)—(6 hrs) and (b) 2125° F. (1163° C.)—(6 hrs)—all test bars for Mod A, B and C were given a final 1600° F.—(20 hrs) age. It is apparent from Table 3 that the 2125° F. (1163° C.) primary age (note the higher Re content of Mod C at 4.8%) gives higher stress-rupture properties at 15.0 ksi/2050° F. (103 MPa/1121° C.) test conditions compared to the 2100° F. (1149° C.) primary age. The properties for both primary age conditions at 36.0 ksi/1800° F. (248 MPa/982° C.) are the same.

The single crystal test bar molds were poured at +30° F. (17° C.) over CMSX-4® conditions for the Mod B and C alloys, based on DSC liquidus data.

The Mod A and Mod B single crystal test bars were pre-homogenized/partially solutioned with the following initial steps—2395° F. (1313° C.)/2 hrs+2405° F. (1318° C.)/2 hrs+2415° F. (1324° C.)/2 hrs+2425° F. (1329° C.)/2 hrs—prior to the selected 2435° F.). (1335° C.)/6 hrs AC, final peak step.

The Mod B single crystal bars ex SMP SX foundry were given an additional 2440° F. (1338° C.)/2 hrs AC peak step to take into account the larger dendrite arm spacing of this mold of test bars.

The Mod C single crystal bars were pre-solutioned as above, but with 6 hrs at the 2425° F. (1329° C.) step, prior to the final peak at 2435° F. (1335° C.)/6 hrs AC.

CMSX-4® Plus Mod B and Mod C
Chemistry Specification Range (Wt % or PPM)

Ni-Base Alloy for SX Casting

| | | | |
|---|---|---|---|
| | | Hf | 0.08-0.15% |
| C | 100 ppm Max | Zr | 150 ppm Max |
| Si | 0.04% Max | Cu | 0.01% Max |
| Mn | 0.01% Max | Fe | 0.15% Max |
| S | 3 ppm Max | V | 0.10% Max |
| P | 30 ppm Max | Ru | 0.15% Max |
| B | 30 ppm Max | Pt | 0.25% Max |
| Cb | 0.15% Max | Pd | 0.20% Max |
| Al | 5.60-5.80% | Mg | 0.02% Max |
| Co | 9.4-9.8% | [N] | 5 ppm Max |
| Cr | 3.2-3.9% | [O] | 5 ppm Max |
| Ta | 7.8-8.5% | | |
| W | 5.3-5.7% | | |
| Mo | 0.50-0.70% | | |
| Re | 4.3-4.9% | | |
| Ti | 0.75-0.90% | | |

For single crystal vane segments or large IGT airfoil components, low angle boundary (LAB) strengthened versions would be necessary with: carbon (C) 0.02-0.05% and boron (B) 50-100 ppm.

| | Mod B | Mod C |
|---|---|---|
| [Ta + Mo + W + Re] | 18.2-19.0 | 18.7-19.5 |
| [Al + Ti + Ta] | 14.25-14.75 | 14.50-15.0 |

Trace Element Controls:—(PPM)

| | | | | | | | |
|---|---|---|---|---|---|---|---|
| Ag | 2 Max | Te | 0.2 Max | Hg | 2 Max | K | 10 Max |
| Bi | 0.2 Max | Tl | 0.2 Max | Cd | 0.2 Max | Ba | 10 Max |
| Ga | 10 Max | Sn | 10 Max | In | 0.2 Max | Th | 2 Max |
| Ca | 25 Max | Sb | 2 Max | Ge | 2 Max | U | 2 Max |
| Pb | 1 Max | As | 2 Max | Au | 2 Max | | |
| Se | 0.5 Max | Zn | 5 Max | Na | 20 Max | | |

TABLE 1

CMSX-4 ® MOD A PLUS HEAT 5V0603
Heat 5V0603 - Mold 968 - RR (SCO) and Mold 52 J - SMP
Fully Heat Treated - Solution + double age

| Test Condition | ID | Rupture Life, Hrs | % Elong (4D) | % RA | Time to 1.0% Creep | Time to 2.0% Creep | SMP ID | Rupture Life, Hrs | % Elong (4D) | % RA | Time to 1.0% Creep | Time to 2.0% Creep |
|---|---|---|---|---|---|---|---|---|---|---|---|---|
| 1418° F./116.0 ksi | | | | | | | 52JFE | 120.3 | 18.9 | 28.7 | 1.2 | 1.7 |
| [770° C./799 MPa] | | | | | | | 52JG0 | 34.9 | 32.0 | 33.5 | 0.9 | 1.2 |
| 1562° F./94.4 ksi | A968 | 182.4 | 23.7 | 25.4 | 1.1 | 13.6 | 52JG1 | 193.6 | 23.2 | 27.8 | 1.0 | 5.5 |
| [850° C./651 MPa] | B968 | 196.2 | 21.6 | 27.3 | 0.6 | 1.4 | 52JG2 | 182.9 | 24.9 | 25.6 | 0.7 | 2.1 |
| 1600° F./75.0 ksi | | | | | | | 52JG3 | 621.7 | 24.6 | 25.1 | 5.7 | 68.6 |
| [871° C./517 MPa] | | | | | | | 52JFU | 647.6 | 30.3 | 31.9 | 81.2 | 166.7 |
| 1742° F./56.6 ksi | | | | | | | 52JFJ | 199.7 | 32.2 | 33.6 | 66.3 | 103.5 |
| [950° C./390 MPa] | | | | | | | 52JFP | 196.9 | 37.6 | 38.6 | 76.7 | 105.9 |
| 1800° F./32.0 ksi | | | | | | | 52JFK | 531.2 | 27.3 | 42.1 | 324.2 | 366.8 |
| [1010° C./248 MPa] | | | | | | | 52JFV | 613.2 | 43.1 | 43.2 | 359.0 | 407.6 |
| 1800° F./36.0 ksi | C968 | 417.7 | 43.7 | 40.4 | 215.5 | 249.7 | 52JFR | 370.7 | 33.8 | 39.6 | 210.3 | 240.6 |
| [982° C./248 MPa] | D968 | 379.2 | 30.9 | 35.5 | 202.5 | 235.7 | 52JFS | 367.2 | 35.8 | 38.9 | 206.2 | 236.5 |
| 1800° F./40.0 ksi | | | | | | | 52JFN | 246.9 | 46.6 | 39.9 | 121.6 | 143.7 |
| [982° C./276 MPa] | | | | | | | 52JFL | 202.7 | 33.9 | 40.8 | 101.1 | 123.6 |
| 1850° F./36.0 ksi | | | | | | | 52JFH | 124.5 | 44.8 | 41.7 | 66.7 | 77.0 |
| [1010° C./248 MPa] | | | | | | | 52JFW | 153.6 | 27.3 | 42.7 | 80.2 | 93.5 |
| 1922° F./27.6 ksi | H968 | 142.8 | 16.8 | 36.3 | 73.2 | 90.3 | 52JFF | 155.2 | 17.8 | 40.2 | 80.1 | 99.7 |
| [1050° C./190 MPa] | K968 | 144.0 | 23.7 | 30.1 | 66.6 | 83.9 | 52JFX | 117.7 | 12.8 | 38.4 | 70.4 | 85.4 |
| 2000° F./18.1 ksi | | | | | | | 52JFG | 371.9 | 36.0 | 37.4 | 184.6 | 225.9 |
| [1093° C./125 MPa] | | | | | | | 52JF | 353.6 | 27.5 | | 175.2 | 221.8 |

TABLE 1-continued

CMSX-4® MOD A PLUS HEAT 5V0603
Heat 5V0603 - Mold 968 - RR (SCO) and Mold 52 J - SMP
Fully Heat Treated - Solution + double age Stress-Rupture

| Test Condition | ID | Rupture Life, hrs | % Elong | % RA | SMP ID | Rupture Life, hrs | % Elong | % RA |
|---|---|---|---|---|---|---|---|---|
| 2050° F./15.0 ksi | M968 | 368.0 | 8.9 | 34.9 | 52JFZ | 326.8 | 9.7 | 36.7 |
| [1121°/103 MPa] | N968 | 370.0 | 20.1 | 38.3 | | | | |

TABLE 2

CMSX-4® PLUS MOD B HEAT 5V0636
Heat 5V0636 - Molds 975 and 977 - RR (SCO and Mold 52 J - SMP
Fully Heat Treated - Solution + double age

| Test Condition | ID | Rupture Life, Hrs | % Elong (4D) | % RA | Time to 1.0% Creep | Time to 2.0% Creep | SMP ID | Rupture Life, Hrs | % Elong (4D) | % RA | Time to 1.0% Creep | Time to 2.0% Creep |
|---|---|---|---|---|---|---|---|---|---|---|---|---|
| 1562° F./94.4 ksi | B975 | 223.7 | 23.3 | 29.5 | 0.7 | 1.6 | 52JF2 | 115.7 | 13.5 | 28.0 | 0.6 | 0.9 |
| [850° C./651 MPa] | A977 | 218.7 | 20.6 | 28.8 | 1.0 | 1.4 | 52JF7 | 113.0 | 18.4 | 26.2 | 0.4 | 0.7 |
| | B977 | 252.1 | 17.9 | 26.4 | 1.0 | 2.1 | | | | | | |
| 1600° F./75.0 ksi | | | | | | | 52JEU | 778.2 | 18.7 | 18.8 | | 246.7 |
| [871° C./517 MPa] | | | | | | | 52JT9 | 859.9 | 20.3 | 23.2 | | 198.3 |
| 1742° F./56.6 ksi | C977 | 222.8 | 28.2 | 29.1 | 95.8 | 125.1 | 52JFD | 198.1 | 20.9 | 31.5 | 67.9 | 103.9 |
| [950° C./390 MPa] | D977 | 237.0 | 31.7 | 33.2 | 108.3 | 140.3 | 52JET | 206.8 | 28.0 | 30.1 | 109.0 | 138.4 |
| 1800° F./36.0 ksi | C975 | 450.9 | 28.5 | 40.2 | 267.2 | 300.0 | | | | | | |
| [982° C./248 MPa] | D975 | 535.1 | 29.0 | 38.3 | 293.3 | 339.6 | | | | | | |
| 1800° F./40.0 ksi | E977 | 268.9 | 28.1 | 35.9 | 157.3 | 179.6 | 52JF6 | 305.8 | 26.2 | 31.1 | 161.2 | 195.8 |
| [982° C./276 MPa] | H977 | 290.8 | 27.3 | 37.0 | 198.9 | 213.3 | 52JFA | 292.3 | 35.2 | 31.8 | 158.9 | 185.3 |
| 1850° F./36.0 ksi | E975 | 179.6 | 31.0 | 38.2 | 89.7 | 106.6 | 52JF1 | 169.7 | 29.3 | 37.8 | 92.6 | 107.6 |
| [1010° C./248 MPa] | H975 | 158.7 | 31.4 | 35.6 | 88.2 | 101.2 | 52JEP | 163.4 | 28.8 | 30.2 | 94.2 | 108.6 |
| 1900° F./25.0 ksi | K977 | 385.6 | 18.1 | 37.2 | 211.1 | 252.7 | | | | | | |
| [1038° C./172 MPa] | M977 | 387.6 | 23.6 | 35.8 | 198.8 | 239.0 | | | | | | |
| 1922° F./27.6 ksi | J975 | 154.4 | 15.1 | 30.6 | 62.4 | 91.2 | 52JEY | 174.6 | 13.5 | 31.6 | 92.1 | 116.3 |
| [1050° C./190 MPa] | K975 | 212.9 | 18.2 | 30.2 | 103.8 | 129.5 | 52JE5 | 162.5 | 13.6 | 31.3 | 85.7 | 108.2 |
| 2000° F./18.1 ksi | N977 | 333.7 | 13.8 | 34.6 | 178.3 | 227.5 | | | | | | |
| [1093° C./125 MPa] | R977 | 395.9 | 18.1 | 33.0 | 195.3 | 245.8 | | | | | | |

Stress-Rupture

| Test Condition | ID | Rupture Life, Hrs | % Elong | % RA |
|---|---|---|---|---|
| 2050° F./15.0 ksi | N975 | 495.4 | 18.1 | 38.5 |
| [1121° C./103 MPa] | R975 | 507.6 | 13.0 | 35.9 |

TABLE 3

CMSX-4® PLUS MOD C HEAT 5V0660
Heat 5V0660 - Molds 978 and 981 - RR SCO - LA12229 (Joliet 0449/CM-421)
Fully Heat Treated - Solution + double age (2 options)

Creep-Rupture

| Test Condition | ID | Rupture Life, hrs | % Elong (4D) | % RA | Time to 1.0% Creep (Hrs) | Time to 2.0% Creep (Hrs) |
|---|---|---|---|---|---|---|
| 1675° F./75.0 ksi | B981** | 218.7 | 21.4 | 30.2 | 2.4 | 33.5 |
| [913° C./248 MPa] | C981** | 213.0 | 16.1 | 20.1 | 24.1 | 69.8 |
| 1800° F./36.0 ksi | B978* | 618.1 | 41.0 | 37.5 | 361.7 | 416.7 |
| [982° C./248 MPa] | C978* | 614.4 | 37.5 | 38.2 | 381.9 | 422.9 |
| | J978** | 611.0 | 34.7 | 37.9 | 379.6 | 416.3 |
| | K978** | 616.4 | 40.8 | 36.4 | 370.9 | 410.0 |
| 1800° F./43.0 ksi | D981** | 278.0 | 29.1 | 37.3 | 168.7 | 190.0 |
| [982° C./296 MPa] | E981** | 273.8 | 24.7 | 36.6 | 172.5 | 195.2 |

TABLE 3-continued

CMSX-4® PLUS MOD C HEAT 5V0660
Heat 5V0660 - Molds 978 and 981 - RR SCO - LA12229 (Joliet 0449/CM-421)
Fully Heat Treated - Solution + double age (2 options)

| 1850° F./36.0 ksi | J981** | 249.7 | 30.2 | 35.4 | 140.5 | 159.5 |
|---|---|---|---|---|---|---|
| [1010° C./248 MPa] | L981** | 203.8 | 24.1 | 29.9 | 119.8 | 135.3 |
| 1922° F./27.6 ksi | L978** | 231.2 | 31.8 | 40.4 | 117.7 | 138.0 |
| [1050° C./190 MPa] | | | | | | |

Stress-Rupture

| Test Condition | ID | Rupture Life, hrs | % Elong | % RA |
|---|---|---|---|---|
| 2050° F./15.0 ksi | E978* | 578.1 | 21.9 | 33.6 |
| [1121°/103 MPa] | H978* | 575.7 | 22.9 | 34.5 |
| | M978** | 654.8 | 16.6 | 39.4 |
| | N978** | 669.7 | 27.5 | 37.7 |

*Primary age - 2100° F. (1149° C.)/6 hrs AC
**Primary age - 2125° F. (1163° C.)/6 hrs AC

TABLE 4

CMSX-4® Plus (SLS) Alloy
Currently completing development by CM - initial V-5 400 lb (180 kgs) heats
5V0603 (MOD A) and 5V0636 (MOD B) and 5V0660 (MOD C)
Stress-Rupture Properties [DL 10s RR Corpn., SMP SX Bars]
Life (hrs)

| | CMSX-4® Plus | | | CMSX-4® | CMSX®-8 |
|---|---|---|---|---|---|
| | MOD A | MOD B | MOD C | | |
| 651 MPa/850° C. (94.4 ksi/1562° F.) | 190 hrs | 224 hrs | | 160 hrs | 142 hrs |
| 517 MPa/871° C. (75.0 ksi/1600° F.) | 635 Hrs | 819 hrs | | 335 hrs | 418 hrs |
| 517 MPa/913° C. (75.0 ksi/1675° F.) | | 128 hrs | 216 hrs | 52 hrs | 67 hrs |
| 390 MPa/950° C. (56.6 ksi/1742° F.) | 198 hrs | 202 hrs | | 70 hrs | 103 hrs |
| 248 MPa/982° C. (36.0 ksi/1800° F.) | 398 hrs | 493 hrs | 615 hrs | 275 hrs | 236 hrs |
| 276 MPa/982° C. (40.0 ksi/1800° F.) | 225 hrs | 299 hrs | | 141 hrs | 144 hrs |
| 296 MPa/982° C. (43.0 ksi/1800° F.) | | 200 hrs | 276 hrs | 88 hrs | 89 hrs |
| 248 MPa/1010° C. (36.0 ksi/1850° F.) | 139 hrs | 169 hrs | 227 hrs | 82 hrs | 85 hrs |
| 190 MPa/1050° C. (27.6 ksi/1922° F.) | 143 hrs | 184 hrs | 231 hrs | 90 hrs | 81 hrs |
| 103 MPa/1121° C. (15.0 KSI/2050° F.) | 369 hrs | 502 hrs | 662 hrs | 640 hrs | 293 hrs |

TABLE 5

CMSX-4® Plus (SLS) Alloy
Currently completing development by CM - initial V-5 400 lb (180 kgs) heats
5V0603 (MOD A) and 5V0636 (MOD B) and 5V0660 (MOD C)
Creep Properties [DL 10s RR Corpn., SMP SX Bars]
Time to 1.0% Creep (hrs)

| | CMSX-4® Plus | | | CMSX-4® | CMSX®-8 |
|---|---|---|---|---|---|
| | MOD A | MOD B | MOD C | | |
| 390 MPa/950° C. (56.6 ksi/1742° F.) | 72 hrs | 88 hrs | | 37 hrs | 36 hrs |
| 248 MPa/982° C. (36.0 ksi/1800° F.) | 209 hrs | 280 hrs | 374 hrs | 125 hrs | 116 hrs |
| 276 MPa/982° C. (40.0 ksi/1800° F.) | 110 hrs | 160 hrs | | 72 hrs | 55 hrs |
| 296 MPa/982° C. (43.0 ksi/1800° F.) | | 93 hrs | 171 hrs | 45 hrs | 39 hrs |
| 248 MPa/1010° C. (36.0 ksi/1850° F.) | 73 hrs | 89 hrs | 130 hrs | 35 hrs | 40 hrs |
| 190 MPa/1050° C. (27.6 ksi/1922° F.) | 70 hrs | 83 hrs | 118 hrs | 37 hrs | 34 hrs |

TABLE 6

CMSX-4® Plus (SLS) Alloy
Currently completing development by CM - initial V-5 400 lb (180 kgs) heats
5V0603 (MOD A) and 5V0636 (MOD B) and 5V0660 (MOD C)
Creep Properties [DL 10s RR Corpn., SMP SX Bars]
Initial Creep Properties
Time to 2.0% Creep (hrs)

| | CMSX-4® Plus | | | CMSX-4® | CMSX®-8 |
|---|---|---|---|---|---|
| | MOD A | MOD B | MOD C | | |
| 390 MPa/950° C. (56.6 ksi/1742° F.) | | 121 hrs | | — | 50 hrs |
| 248 MPa/982° C. (36.0 ksi/1800° F.) | 243 hrs | 320 hrs | 416 hrs | 160 hrs | 136 hrs |
| 276 MPa/982° C. (40.0 ksi/1800° F.) | 134 hrs | 190 hrs | | — | 79 hrs |
| 248 MPa/1010° C. (36.0 ksi/1850° F.) | 85 hrs | 103 hrs | 147 hrs | 45 hrs | 48 hrs |
| 190 MPa/1050° C. (27.6 ksi/1922° F.) | 87 hrs | 110 hrs | 138 hrs | 54 hrs | 43 hrs |

TABLE 7

CMSX-4® Plus (SLS) Mod C
The creep-rupture properties of the above alloy are quite close to that of CMSX-10K® [6.3% Re] - see table below (not density corrected).
Based on typical average properties:-

| | | Time to Rupture | Time to 1% Creep | Time to 2% Creep |
|---|---|---|---|---|
| 248 MPa/982° C. (36.0 ksi/1800° F.) | CMSX-4® Plus Mod C (5V0660) | 615 hrs | 374 hrs | 416 hrs |
| | CMSX-10K® | 718 hrs | 390 hrs | 459 hrs |
| 103 MPa/1121° C. (15.0 ksi/2050° F.) | CMSX-4® Plus Mod C (5V0660) | 662 hrs | NA | NA |
| | CMSX-10K® | 558 hrs | NA | NA |

The density at room temperature of CMSX-4® Plus Mod B (5V0636) determined by the National Physical Laboratories in the UK is 8.887 kg/dm$^3$—see table below for comparison with other SX alloys.

| Alloy | Density (RT) kg/dm$^3$ |
|---|---|
| CMSX-4® | 8.70 |
| AM 1 | 8.59 |
| PWA 1484 | 8.95 |
| SC 180 | 8.84 |
| Rene' N-6 | 8.97 |
| CMSX-10K® | 9.05 |
| CMSX-4® Plus Mod B | 8.89 |

TABLE 8

CMSX-4® PLUS MOD B ALLOY ROOM AND ELEVATED TEMPERATURE TENSILE DATA

| | Identification | Test Temp., ° F. | 0.2% Offset Yield Strength, Psi | Ultimate Tensile Strength, Psi | % Elong. | % RA |
|---|---|---|---|---|---|---|
| 1. | D78B | 70 | 137,900 | 137,900 | 17.5 | 21.1 |
| 2. | K78M | 70 | 140,800 | 140,800 | 15.5 | 17.1 |
| 3. | D78M | 800 | 139,400 | 140,100 | 13.2 | 16.2 |
| 4. | K78T | 800 | 144,200 | 152,000 | 12.3 | 15.5 |
| 5. | D78T | 1000 | 135,300 | 146,200 | 17.5 | 20.1 |
| 6. | L78B | 1000 | 131,600 | 137,900 | 19.8 | 22.9 |
| 7. | I78B | 1100 | 146,600 | 160,900 | 10.2 | 15.5 |
| 8. | L78M | 1100 | 137,400 | 141,300 | 12.6 | 21.2 |
| 9. | I78M | 1200 | 139,000 | 159,800 | 14.5 | 24.7 |
| 10. | L78T | 1200 | 135,600 | 145,300 | 13.6 | 20.4 |
| 11. | I78T | 1400 | 146,800 | 178,800 | 8.9 | 18.7 |
| 12. | M78B | 1400 | 134,700 | 153,500 | 12.6 | 24.9 |
| 13. | J78B | 1600 | 143,800 | 155,400 | 22.6 | 24.0 |
| 14. | M78M | 1600 | 142,700 | 155,700 | 30.6 | 31.1 |
| 15. | J78M | 1700 | 120,500 | 138,600 | 25.9 | 26.7 |
| 16. | M78T | 1700 | 98,600 | 98,600 | 32.7 | 33.9 |

Figure 2:
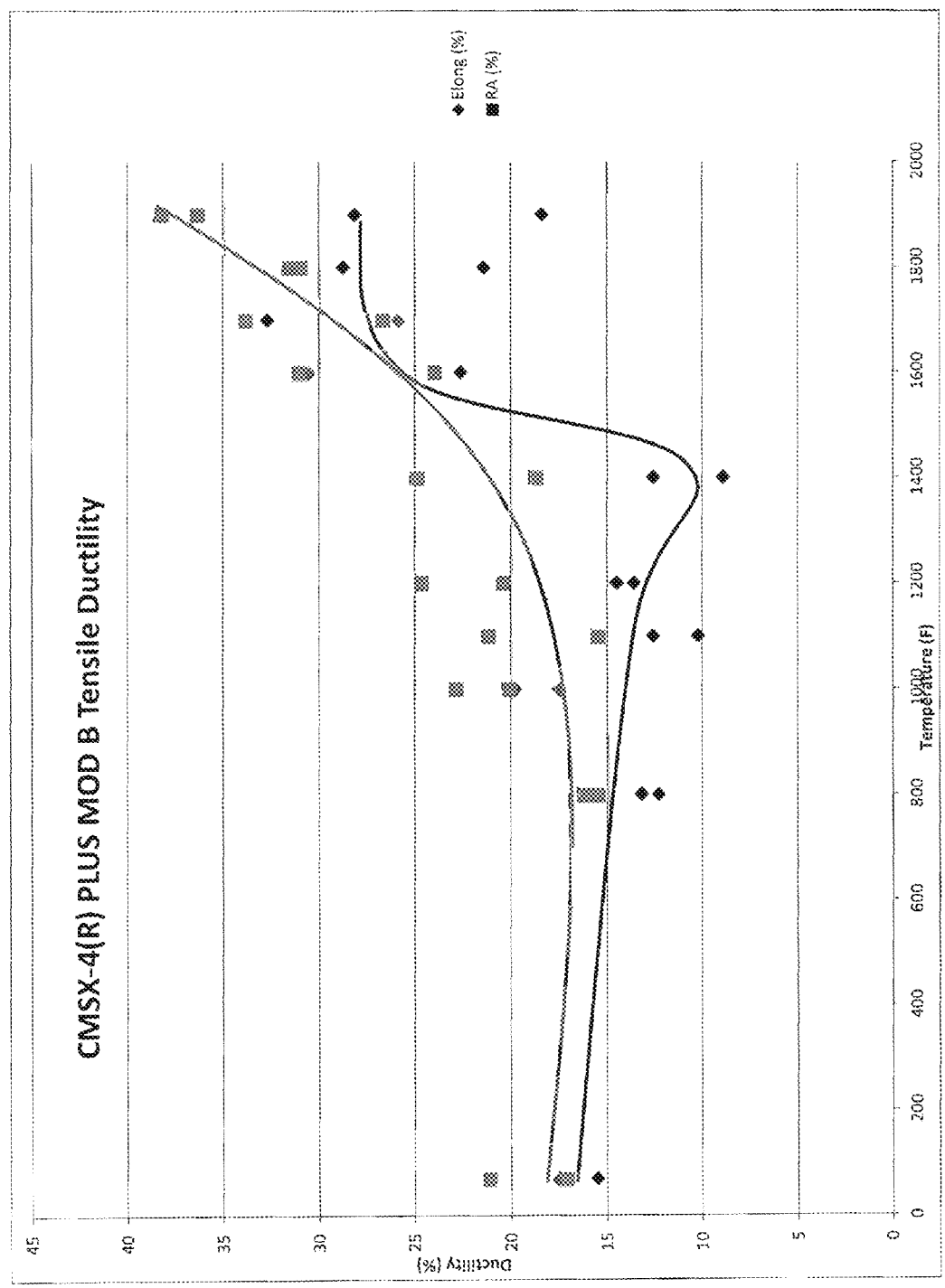
FIG. 2 is a graph of percent elongation and percent reduction in area for an alloy as disclosed herein.

The 0.2% offset yield strength (YS) the ultimate tensile strength (UTS), percent elongation at the ultimate tensile strength (% Elong), and percent area reduction at the ultimate tensile strength (% RA) at various temperatures for single crystal casting specimens prepared from The MOD B disclosed alloy is presented in Table 8 and illustrated graphically in FIGS. 1 and 2. These data show excellent tensile properties at high temperatures, for strength and ductility.

Figure 3:
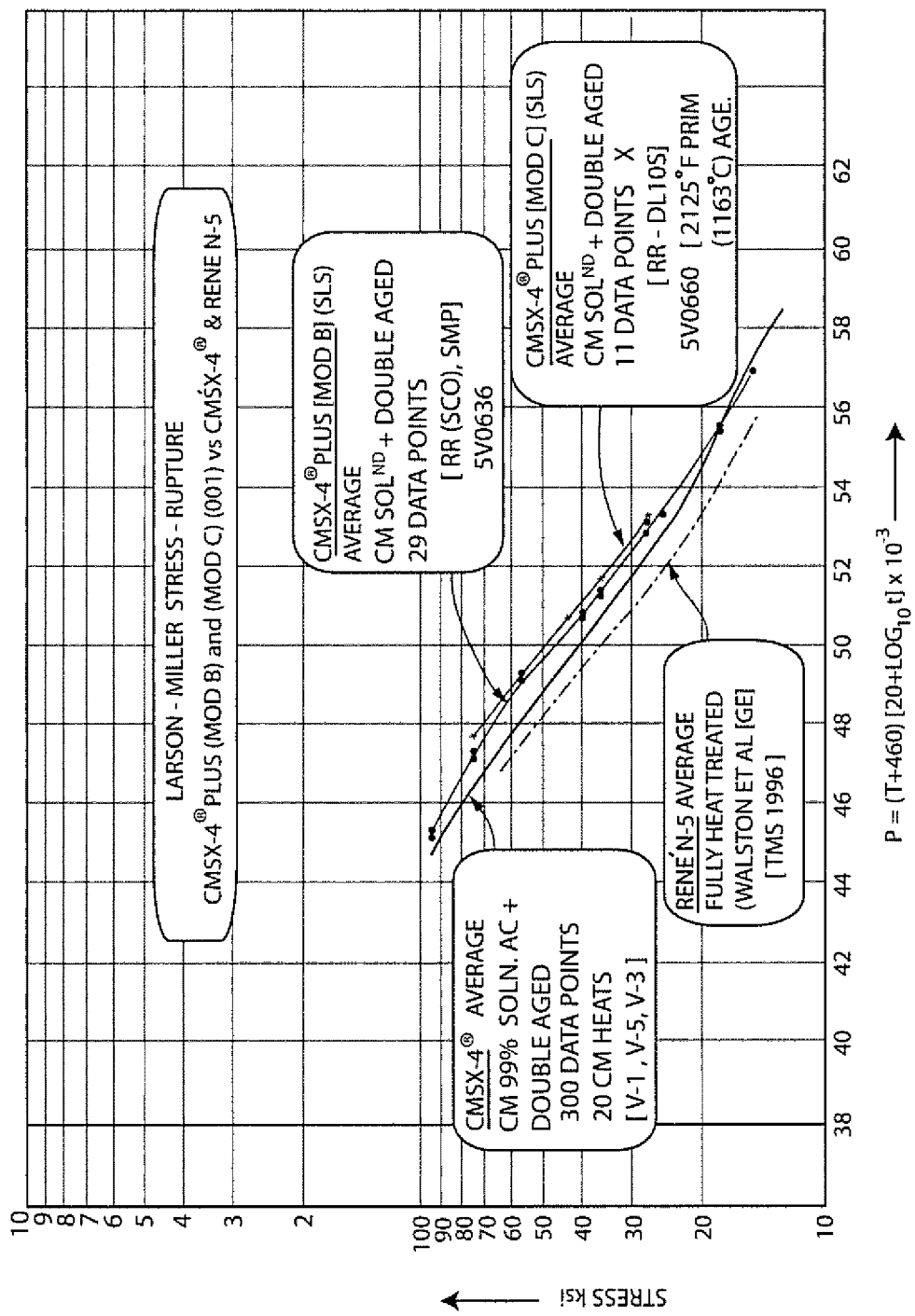
FIGS. 3 and 4 are Larson-Miller plots comparing alloys according to this disclosure with commercially available alloys widely used in high temperature, high stress gas turbine applications.
Figure 4:
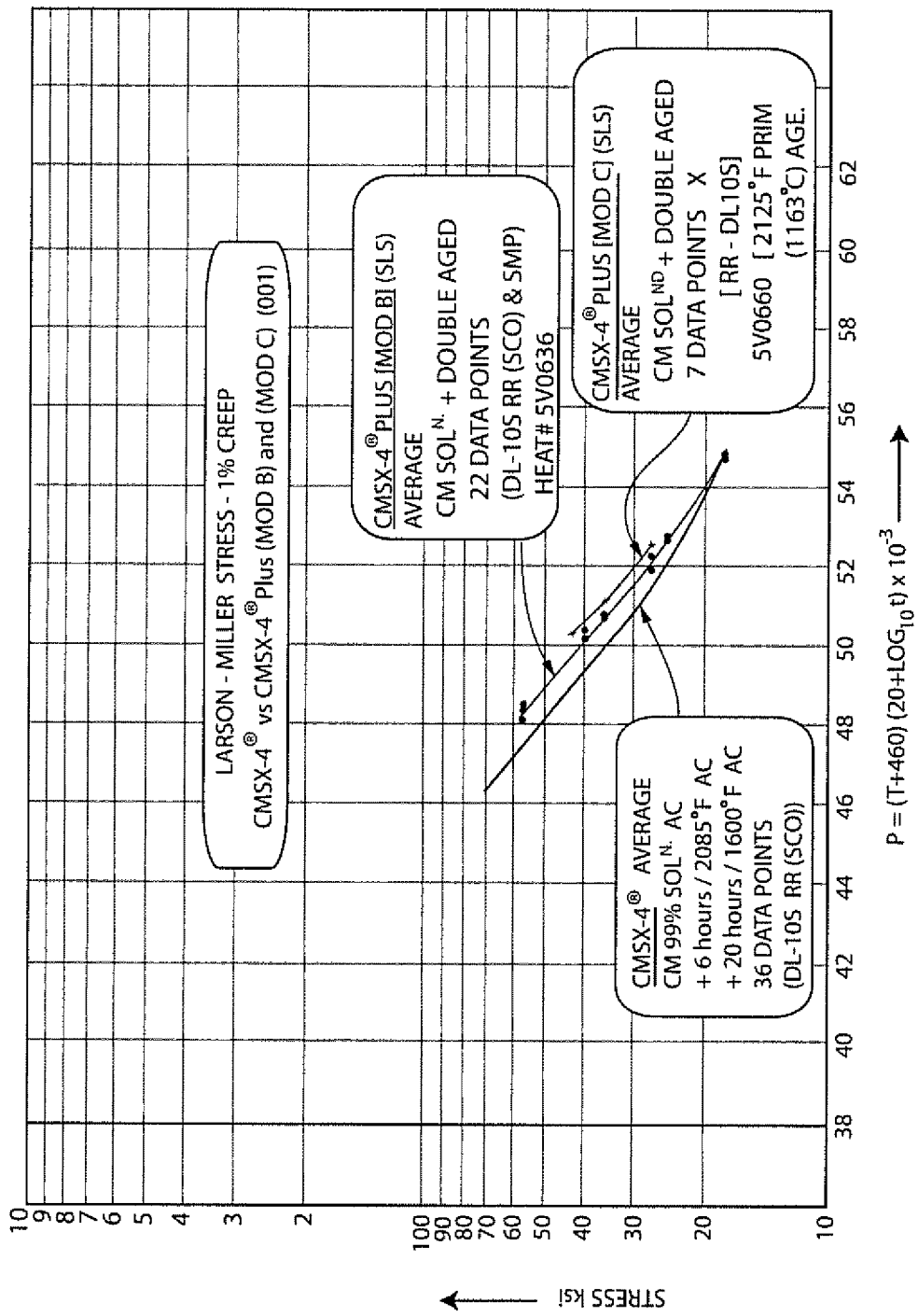
Figure 15:
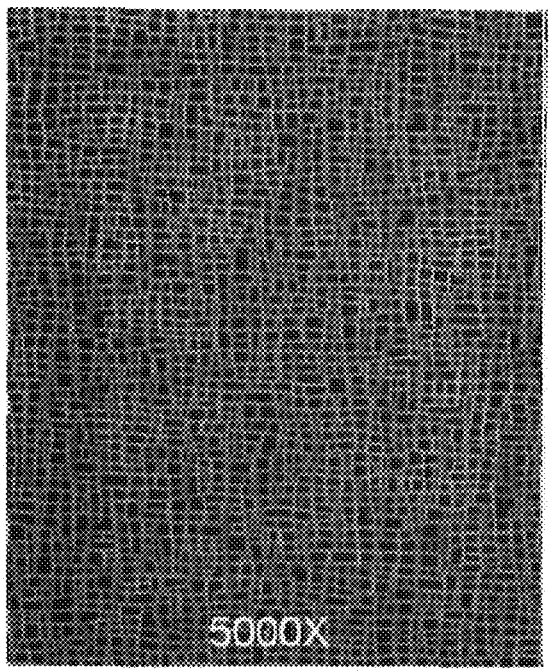
FIGS. 15 and 16 are scanning electron micrographs of the CMSX-4® PLUS (MOD C) single crystal test bar (#N978) that was fully heat treated.
Figure 16:
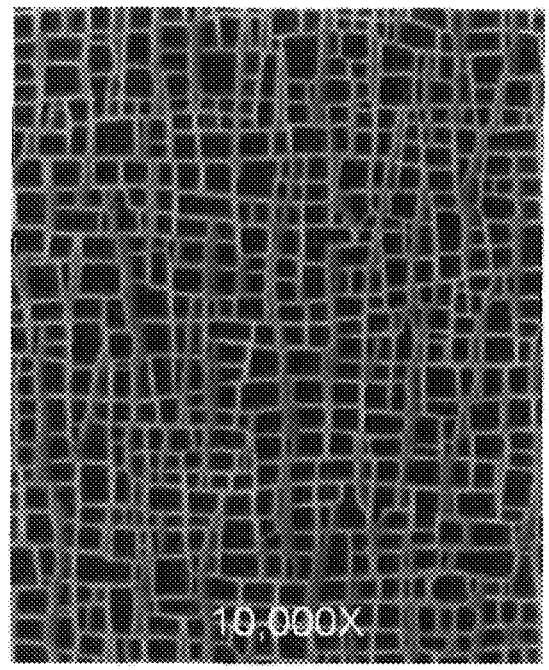

FIGS. 3 and 4 are Larson-Miller stress-rupture diagrams comparing the newly disclosed alloys (CMSX-4® PLUS [MOD B] alloy and CMSX-4® PLUS [MOD C] alloy) with well known commercially available nickel-base superalloys for single crystal casting (CMSX-4® alloy and RENÉ N-5 alloy). The illustrated results indicate that a substantial improvement in stress-rupture life for the disclosed alloys as compared with known alloys that are currently used and recognized as preferred materials for casting turbine components for high-temperature, high stress applications.

The optical photographs (FIGS. 5 and 6) of a CMSX-4® PLUS (MOD A) single crystal test bar show no γ/γ' eutectic phase and no incipient melting after being fully heat treated (i.e., solutioned and double aged).

The scanning electron micrographs (FIGS. 7 and 8) of the CMSX-4® PLUS (MOD A) single crystal test bar that was fully heat treated (solutioned and double aged) shows aligned cubic γ' particles having a mean size of about 0.55 micrometers, indicating an appropriate γ/γ' mis-match.

The optical photographs (FIGS. 9 and 10) of a CMSX-4® PLUS (MOD B) single crystal test bar that was solutioned and primary aged shows very small amount of remnant γ/γ' eutectic phase and no incipient melting.

The scanning electron micrographs (FIGS. 11 and 12) of the CMSX-4® PLUS (MOD B) single crystal test bar that was solutioned and primary aged shows dark, aligned cubic γ' particles having a mean size of about 0.45, indicating an appropriate γ' mis-match.

The optical photographs (FIGS. 13 and 14) of a CMSX-4® PLUS (MOD C) single crystal test bar that was fully heat treated (solutioned and primary aged for 6 hours at 2125° F. (1163° C.)) show a small amount of remnant γ/γ' eutectic phase (the white spots), indicating no incipient melting.

The scanning electron micrographs (FIGS. 15 and 16) of the CMSX-4® PLUS (MOD C) single crystal test bar that was fully heat treated shows dark, aligned cubic γ' particles having a mean particle size of about 0.45 micrometers, indicating an appropriate γ/γ' mis-match.

The optical photographs (FIGS. 17 and 18) of a CMSX-4® PLUS (MOD C) single crystal test bar that was fully heat treated (solutioned and primary aged for 6 hours at 2125° F.

(1163° C.)), and stress-rupture tested at 15 ksi (103 MPa) and 2050° F. (1121° C.) for 669.7 hours life, shows minimal TCP linear dark etching phase, indicating good alloy phase stability.

What is claimed is:

1. A nickel-base superalloy for single crystal casting, comprising:
    5.60% to 5.80% by weight of aluminum;
    9.4% to 9.8% by weight of cobalt;
    3.2% to 3.9% by weight of chromium;
    7.8% to 8.5% by weight of tantalum;
    5.3% to 5.7% by weight of tungsten;
    0.50% to 0.70% by weight of molybdenum;
    4.3% to 4.9% by weight of rhenium;
    0.75% to 0.90% by weight of titanium;
    0.08% to 0.15% by weight of hafnium;
    a maximum of 5 ppm nitrogen by weight,
    less than 1.1% by weight of elements other than aluminum, cobalt, chromium, tantalum, tungsten, molybdenum, rhenium, titanium and nickel; and
    the balance nickel, wherein the casting exhibits a time to 2.0% creep under a stress of 248 MPa (36.0 ksi) and at a temperature of 982° C. (1800° F.) of about 320 hours or greater.

2. The superalloy of claim 1, comprising the following maximum amounts by weight of elements: 100 ppm carbon, 0.04% silicon, 0.01% manganese, 3 ppm sulfur, 30 ppm phosphorus, 30 ppm boron, 0.15% niobium, 150 ppm zirconium, 0.01% copper, 0.15% iron, 0.10% vanadium, 0.15% ruthenium, 0.25% platinum, 0.20% palladium, 0.02% magnesium, 5 ppm nitrogen, 5 ppm oxygen, 2 ppm silver, 0.2 ppm bismuth, 10 ppm gallium, 25 ppm calcium, 1 ppm lead, 0.5 ppm selenium, 0.2 ppm tellurium, 0.2 ppm thallium, 10 ppm tin, 2 ppm antimony, 2 ppm arsenic, 5 ppm zinc, 2 ppm mercury, 0.2 ppm cadmium, 0.2 ppm indium, 2 ppm germanium, 2 ppm gold, 20 ppm sodium, 10 ppm potassium, 10 ppm barium, 2 ppm thorium, and 2 ppm uranium.

3. The superalloy of claim 1, containing carbon in an amount of from 0.02% to 0.05% by weight and boron in an amount of from 50 ppm to 100 ppm by weight.

4. A single crystal casting made from the nickel-base superalloy of claim 1, having a magnesium content of about 2 ppm.

5. The superalloy of claim 1 in which the total amount of tantalum, molybdenum, tungsten and rhenium is from 18.2% to 19.5% by weight.

6. The superalloy of claim 5, comprising the following maximum amounts by weight of elements: 100 ppm carbon, 0.04% silicon, 0.01% manganese, 3 ppm sulfur, 30 ppm phosphorus, 30 ppm boron, 0.15% niobium, 150 ppm zirconium, 0.01% copper, 0.15% iron, 0.10% vanadium, 0.15% ruthenium, 0.25% platinum, 0.20% palladium, 0.02% magnesium, 5 ppm nitrogen, 5 ppm oxygen, 2 ppm silver, 0.2 ppm bismuth, 10 ppm gallium, 25 ppm calcium, 1 ppm lead, 0.5 ppm selenium, 0.2 ppm tellurium, 0.2 ppm thallium, 10 ppm tin, 2 ppm antimony, 2 ppm arsenic, 5 ppm zinc, 2 ppm mercury, 0.2 ppm cadmium, 0.2 ppm indium, 2 ppm germanium, 2 ppm gold, 20 ppm sodium, 10 ppm potassium, 10 ppm barium, 2 ppm thorium, and 2 ppm uranium.

7. The superalloy of claim 1, in which the total amount of aluminum, titanium and tantalum is from 14.25% to 15.0% by weight.

8. The superalloy of claim 7, comprising the following maximum amounts by weight of elements: 100 ppm carbon, 0.04% silicon, 0.01% manganese, 3 ppm sulfur, 30 ppm phosphorus, 30 ppm boron, 0.15% niobium, 150 ppm zirconium, 0.01% copper, 0.15% iron, 0.10% vanadium, 0.15% ruthenium, 0.25% platinum, 0.20% palladium, 0.02% magnesium, 5 ppm nitrogen, 5 ppm oxygen, 2 ppm silver, 0.2 ppm bismuth, 10 ppm gallium, 25 ppm calcium, 1 ppm lead, 0.5 ppm selenium, 0.2 ppm tellurium, 0.2 ppm thallium, 10 ppm tin, 2 ppm antimony, 2 ppm arsenic, 5 ppm zinc, 2 ppm mercury, 0.2 ppm cadmium, 0.2 ppm indium, 2 ppm germanium, 2 ppm gold, 20 ppm sodium, 10 ppm potassium, 10 ppm barium, 2 ppm thorium, and 2 ppm uranium.

9. A nickel-base superalloy for single crystal casting, comprising:
    5.60% to 5.80% by weight of aluminum;
    9.4% to 9.8% by weight of cobalt;
    3.2% to 3.9% by weight of chromium;
    7.8% to 8.5% by weight of tantalum;
    5.3% to 5.7% by weight of tungsten;
    0.50% to 0.70% by weight of molybdenum;
    4.3% to 4.9% by weight of rhenium;
    0.75% to 0.90% by weight of titanium;
    0.08% to 0.15% by weight of hafnium;
    a maximum of 5 ppm nitrogen by weight;
    less than 1.1% by weight of elements other than aluminum, cobalt, chromium, tantalum, tungsten, molybdenum, rhenium, titanium and nickel; and
    the balance nickel;
    wherein the casting exhibits a time to 2.0% creep under a stress of 248 MPa (36.0 ksi) and at a temperature of 982° C. (1800° F.) of about 320 hours or greater;
    provided that the total amount of tantalum, molybdenum, tungsten and rhenium is from 18.2% to 19.5% by weight; and
    provided that the total amount of aluminum, titanium, and tantalum is from 14.25% to 15.0% by weight.

10. The superalloy of claim 9, comprising the following maximum amounts by weight of elements: 100 ppm carbon, 0.04% silicon, 0.01% manganese, 3 ppm sulfur, 30 ppm phosphorus, 30 ppm boron, 0.15% niobium, 150 ppm zirconium, 0.01% copper, 0.15% iron, 0.10% vanadium, 0.15% ruthenium, 0.25% platinum, 0.20% palladium, 0.02% magnesium, 5 ppm nitrogen, 5 ppm oxygen, 2 ppm silver, 0.2 ppm bismuth, 10 ppm gallium, 25 ppm calcium, 1 ppm lead, 0.5 ppm selenium, 0.2 ppm tellurium, 0.2 ppm thallium, 10 ppm tin, 2 ppm antimony, 2 ppm arsenic, 5 ppm zinc, 2 ppm mercury, 0.2 ppm cadmium, 0.2 ppm indium, 2 ppm germanium, 2 ppm gold, 20 ppm sodium, 10 ppm potassium, 10 ppm barium, 2 ppm thorium, and 2 ppm uranium.

11. The superalloy of claim 9, containing carbon in an amount of from 0.02% to 0.05% by weight and boron in an amount of from 50 ppm to 100 ppm by weight.

12. A nickel-base superalloy for single crystal casting, comprising:
    a maximum of 100 ppm by weight of carbon;
    a maximum of 0.04% by weight of silicon;
    a maximum of 0.01% by weight of manganese;
    a maximum of 3 ppm by weight of sulfur;
    a maximum of 30 ppm by weight of phosphorus;
    a maximum of 30 ppm by weight of boron;
    a maximum of 0.15% by weight of niobium;
    a maximum of 150 ppm by weight of zirconium;
    a maximum of 0.01% by weight of copper;
    a maximum of 0.15% by weight of iron;
    a maximum of 0.10% by weight of vanadium;
    a maximum of 0.15% by weight of ruthenium;
    a maximum of 0.25% by weight of platinum;
    a maximum of 0.20% by weight of palladium;
    a maximum of 0.02% by weight of magnesium;
    a maximum of 5 ppm by weight of nitrogen;
    a maximum of 5 ppm by weight of oxygen;

a maximum of 2 ppm by weight of silver;
a maximum of 0.2 ppm by weight of bismuth;
a maximum of 10 ppm by weight of gallium;
a maximum of 25 ppm by weight of calcium;
a maximum of 1 ppm by weight of lead;
a maximum of 0.5 ppm by weight of selenium;
a maximum of 0.2 ppm by weight of tellurium;
a maximum of 0.2 ppm by weight of thallium;
a maximum of 10 ppm by weight of tin;
a maximum of 2 ppm by weight of antimony;
a maximum of 2 ppm by weight of arsenic;
a maximum of 5 ppm by weight of zinc;
a maximum of 2 ppm by weight of mercury;
a maximum of 0.2 ppm by weight of cadmium;
a maximum of 02 ppm by weight of indium;
a maximum of 2 ppm by weight of germanium;
a maximum of 2 ppm by weight of gold;
a maximum of 20 ppm by weight of sodium;
a maximum of 10 ppm by weight of potassium;
a maximum of 10 ppm by weight of barium;
a maximum of 2 ppm by weight of thorium;
a maximum of 2 ppm by weight of uranium;
5.60% to 5.80% by weight of aluminum;
9.4% to 9.8% by weight of cobalt;
3.2% to 3.9% by weight of chromium;
7.8% to 8.5% by weight of tantalum;
5.3% to 5.7% by weight of tungsten;
0.50% to 0.70% by weight of molybdenum;
4.3% to 4.9% by weight of rhenium;
0.75% to 0.90% by weight of titanium;
0.08% to 0.15% by weight of hafnium; and
the balance nickel;
wherein the casting exhibits a time to 2.0% creep under a stress of 248 MPa (36.0 ksi) and at a temperature of 982° C. (1800° F.) of about 320 hours or greater;
provided that the total amount of tantalum, molybdenum, tungsten and rhenium is from 18.2% to 19.5% by weight; and
provided that the total amount of aluminum, titanium, and tantalum is from 14.25% to 15.0% by weight.

* * * * *